United States Patent
Sakamoto

(10) Patent No.: US 6,498,308 B2
(45) Date of Patent: *Dec. 24, 2002

(54) SEMICONDUCTOR MODULE

(75) Inventor: Akira Sakamoto, Tokyo (JP)

(73) Assignee: Oki Electric Industry Co., Ltd., Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/522,924

(22) Filed: Mar. 10, 2000

(65) Prior Publication Data

US 2002/0097566 A1 Jul. 25, 2002

(30) Foreign Application Priority Data

Apr. 2, 1999 (JP) .............................. 11-096414

(51) Int. Cl.⁷ .............................. H05K 3/32; H05K 3/34
(52) U.S. Cl. .................. 174/260; 361/772; 361/774; 361/777; 361/779; 257/696; 257/773; 257/775; 257/779
(58) Field of Search .............................. 361/773, 774, 361/777, 779, 767, 772, 771; 174/260, 250; 257/696, 775, 693, 695, 735, 773, 779; 228/180.21, 180.22; 438/119; 29/832, 840

(56) References Cited

U.S. PATENT DOCUMENTS

| 4,657,172 A | * | 4/1987 | Lee ....................... 228/180.21 |
| 4,667,401 A | * | 5/1987 | Clements et al. ............ 252/511 |
| 5,328,087 A | * | 7/1994 | Nelson et al. .......... 228/180.22 |
| 5,383,094 A | * | 1/1995 | Estes ........................... 361/773 |
| 5,523,920 A | * | 6/1996 | Machuga et al. ....... 228/180.22 |
| 5,729,896 A | * | 3/1998 | Dalal et al. ............. 228/180.22 |
| 5,796,591 A | * | 8/1998 | Dalal et al. .................. 361/779 |
| 5,825,629 A | * | 10/1998 | Hoebener et al. ............ 361/777 |
| 5,871,592 A | * | 2/1999 | Asagi et al. ............ 228/180.21 |
| 5,878,942 A | * | 3/1999 | Kodama et al. ........ 228/180.22 |
| 5,920,464 A | * | 7/1999 | Yokoyama et al. .......... 361/779 |
| 6,002,172 A | * | 12/1999 | Desai et al. .................. 257/737 |
| 6,018,197 A | * | 1/2000 | Saiki et al. ................... 257/738 |
| 6,144,558 A | * | 11/2000 | Shiota et al. ................. 174/254 |
| 6,315,856 B1 | * | 11/2001 | Asagiri et al. ............... 156/277 |

FOREIGN PATENT DOCUMENTS

| JP | 3-81672 | 8/1991 |
| JP | 4-291987 | 10/1992 |
| JP | 6-151506 | 5/1994 |
| JP | 8-162736 | 6/1996 |

* cited by examiner

Primary Examiner—Kamand Cuneo
Assistant Examiner—John B. Vigushin
(74) Attorney, Agent, or Firm—Volentine Francos, PLLC

(57) ABSTRACT

A semiconductor module includes a chip formed with an integrated circuit, a first external connecting terminal electrically connected to the integrated circuit, a printed wiring board having a second external connecting terminal, and a conductive material electrically connecting the first external connecting terminal with the second external connecting terminal, wherein the conductive material is formed so as to cover a sidewall of the second external connecting terminal. Accordingly, a semiconductor module is provided that can avoid an inferior connection caused by a crack between the lead and the pad.

6 Claims, 3 Drawing Sheets

FIG. 3A
(PRIOR ART)
FIG. 3B
(PRIOR ART)
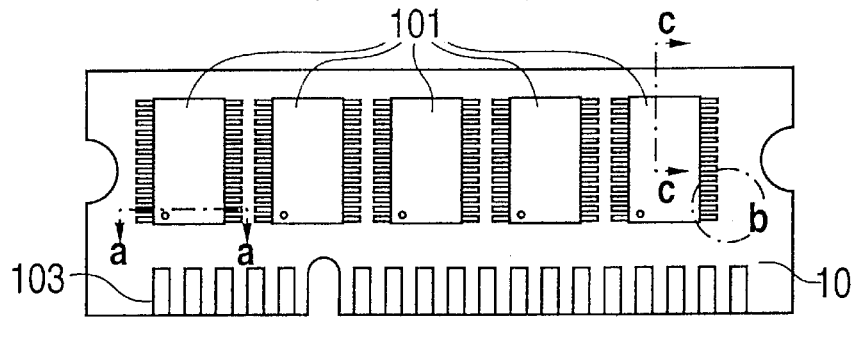
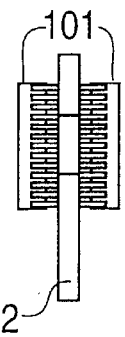
FIG. 3C
(PRIOR ART)
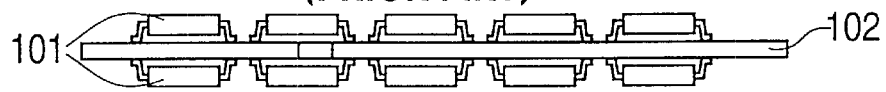
FIG. 4
(PRIOR ART)
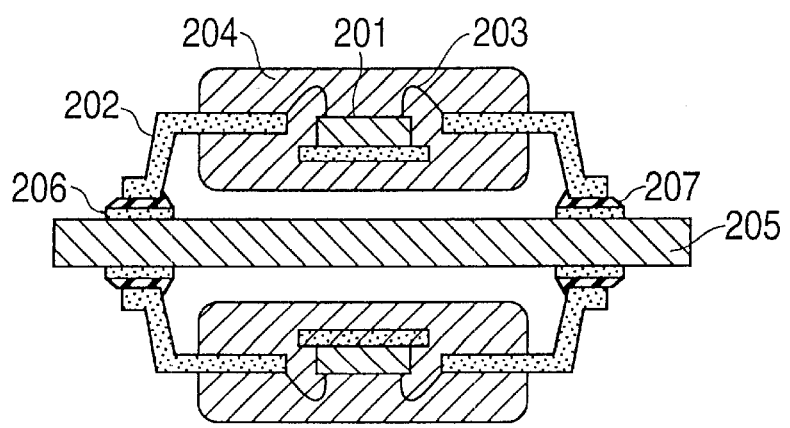

SEMICONDUCTOR MODULE

BACKGROUND OF THE INVENTION

1. Field of the Invention

The present invention generally relates to a semiconductor module, and more particularly, the present invention relates to a pattern shape for a contacting portion formed on a printed wiring board.

This application is a counterpart of Japanese application Serial Number 096414/1999, filed Apr. 2, 1999, the subject matter of which is incorporated herein by reference.

2. Description of the Related Art

FIG. 3 is a schematic diagram showing a semiconductor module of a conventional art.

As shown in FIG. 3, a plurality of surface mounting type semiconductor packages 101 (e.g. T-SOP (Thin-small Outline Package) is mounted on a memory module. Concretely, for forming an electric circuit, the plurality of surface mounting type semiconductor packages 101 are formed on a printed wiring board 102 (e.g. a glass epoxy resin substrate, or a ceramic substrate). The printed wiring board 102 has a structure formed of a conductive pattern on an insulating material. For electrically connecting a module product with an external device (e.g. a personal computer), a plurality of external terminals 103 is formed on the printed wiring board 102.

FIG. 4 is a cross-sectional view taken in the direction of the arrows substantially along the line a—a of FIG. 3.

As shown in FIG. 4, the plurality of surface mounting type semiconductor packages 101 is made up of a semiconductor device 201 having an integrated circuit, a lead 2020 for transferring an electrical signal of the semiconductor device 201 to an external portion, a wiring 203 (e.g. the wiring made of a gold or aluminum) for transferring an electrical signal of the semiconductor device 201 to the lead 202, a resin 204 (e.g. an epoxy resin, a silicon resin) for protecting the semiconductor device 201 and the wiring 203 from an external force, a printed wiring board 205 (e.g. a glass epoxy substrate, a ceramic substrate) formed of a conductive pattern, a pad 206 for transferring an electrical signal of the semiconductor device 201 formed on the printed wiring board 205 to the external portion, a conductive material 3.g. a solder, a conductive resin, an Ag paste) electrically connecting the lead 202 with the pad 206. The plurality of surface mounting type semiconductor packages 101 constructed as mentioned above is mounted on an upper surface and a lower surface of the printed wiring board 205.

FIG. 5 is an enlarged plane view of b portion in FIG. 3. As shown in FIG. 5, a pad 302 formed on a printed wiring board 301 has a width wider than a lead 304.

FIG. 6 is a cross-sectional view taken in the direction of the arrows substantially along the line c—c of FIG. 3.

As shown in FIG. 6, a lead 403 for the plurality of surface mounting type semiconductor packages 101 is electrically connected to a pad 402 formed on a printed wiring board 401 via a conductive material. The pad 402 is set to a width wider than a lead 403.

In the conventional art, it is desired to avoid inferior connections caused by cracks between the lead and the pad.

SUMMARY OF THE INVENTION

An object of the present invention is to provide a semiconductor module that can avoid inferior connections caused by cracks between the lead and the pad.

According to one aspect of the present invention, for achieving the above object, there is provided a semiconductor module comprising a chip formed with an integrated circuit, a first external connecting terminal electrically connected to the integrated circuit, a printed wiring board having a second external connecting terminal; and a conductive material electrically connecting the first external connecting terminal with the second external connecting terminal, wherein the conductive material is formed so as to cover a sidewall of the second external connecting terminal.

BRIEF DESCRIPTION OF THE DRAWINGS

While the specification concludes with claims particularly pointing out and distinctly claiming the subject matter that is regarded as the invention, the invention, along with the objects, features, and advantages thereof, will be better understood from the following description taken in connection with the accompanying drawings, in which:

FIG. 3 is a schematic diagram showing a semiconductor module of a conventional art.

FIG. 4 is a cross-sectional view taken in the direction of the arrows substantially along the line a—a of FIG. 3.

DETAILED DESCRIPTION OF THE PREFERRED EMBODIMENTS

An internal generating circuit according to a first preferred embodiment of the present invention will hereinafter be described in detail with reference to the accompanying drawings.

Figure 1:
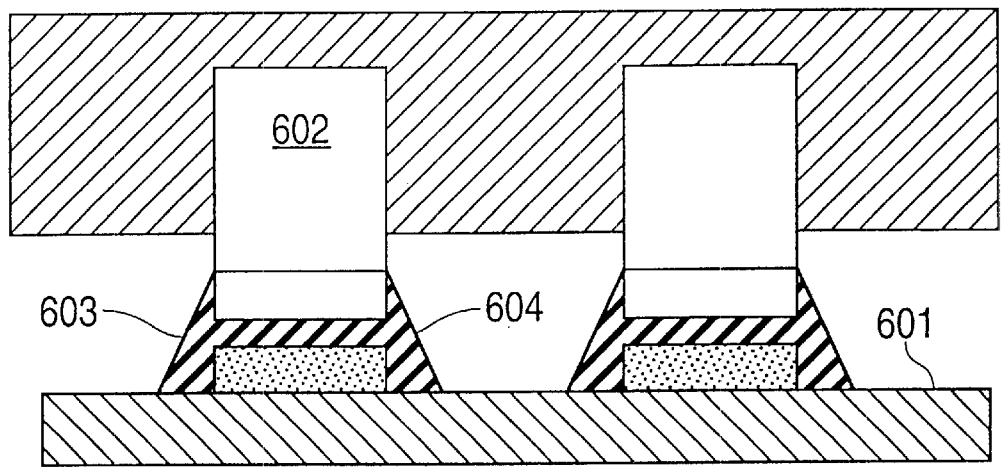
FIG. 1 is a cross-sectional view showing a semiconductor module according to a first preferred embodiment of the present invention.

FIG. 1 is a cross-sectional view showing a semiconductor module according to a first preferred embodiment of a present invention.

As shown in FIG. 1, a semiconductor module is preferably made up of a printed wiring board 601 (e.g. a glass epoxy resin substrate, a ceramic substrate) formed with a plurality of conductive patterns on a surface, a semiconductor package having a chip formed with an integrated circuit (not shown) on a surface and a plurality of leads 602 as a first external connecting terminal electrically connected to the integrated circuit, a plurality of pads 603 as a second external connecting terminal formed on the printed wiring board 601, and a plurality of conductive materials 605 (e.g. a solder, a conductive resin, an AG paste) electrically connected between each of leads 602 and each of pads 603.

The first preferred embodiment of the present invention is characterized by each of pads 603 having a width equal to or narrower than each of leads 602. As a result, the respective conductive materials 604 is formed so as to cover a sidewall of the respective pads 603.

Accordingly, the first preferred embodiment of the present invention can increase a contact area of the conductive material against the pad.

As mentioned above, the first preferred embodiment of the present invention can avoid inferior connection caused by a crack between the lead and the pad as a result of the increasing of the contact area.

Figure 2:
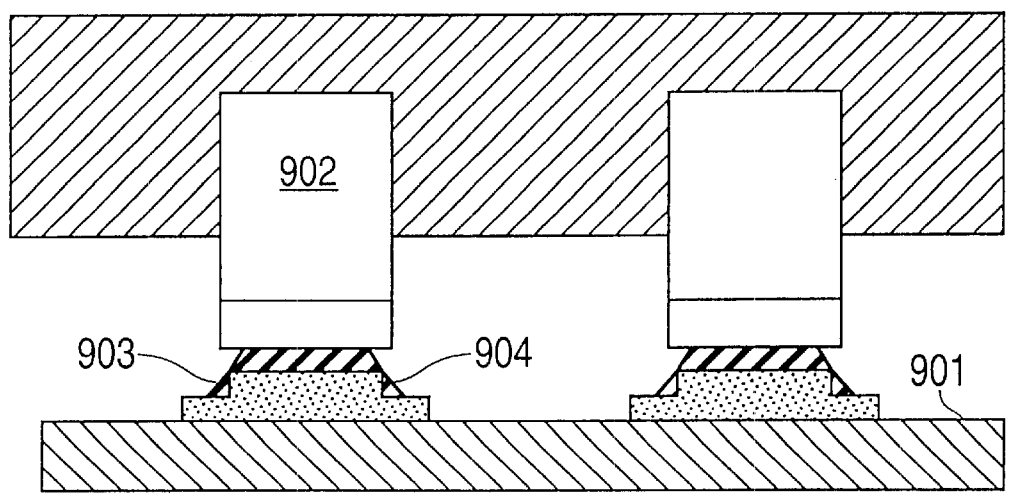
FIG. 2 is a cross-sectional view showing a semiconductor module according to a second preferred embodiment of the present invention.
Figure 5:
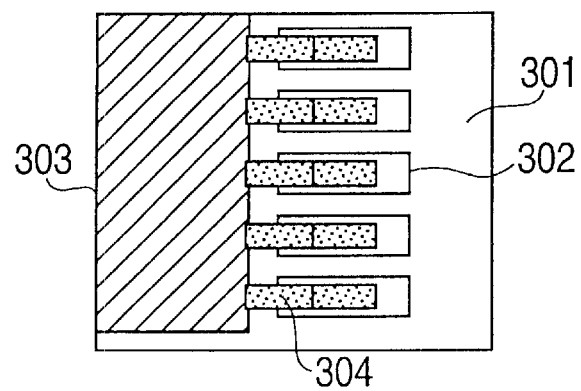
FIG. 5 is an enlarged plane view of b portion in FIG. 3.
Figure 6:
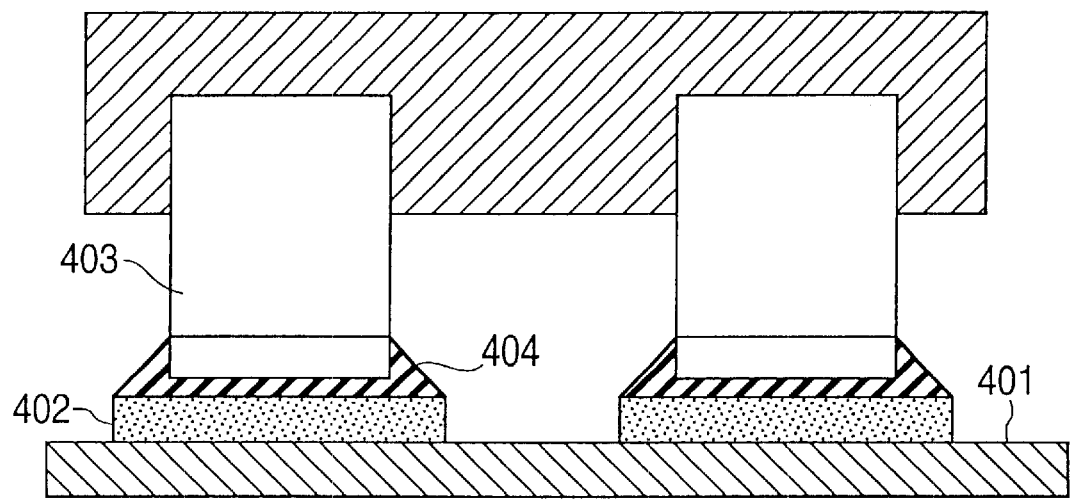
FIG. 6 is a cross-sectional view taken in the direction of the arrows substantially along the line c—c of FIG. 3.

FIG. 2 is a cross-sectional view showing a semiconductor module according to a second preferred embodiment of the present invention.

As shown in FIG. 2, a semiconductor module is preferably made up of a printed wiring board 901 (e.g. a glass epoxy resin substrate, a ceramic substrate formed with a plurality of conductive patterns on a surface, a semiconductor package having a chip formed with an integrated circuit (not shown) on a surface and a plurality of leads 902 as a first external connecting terminal electrically connected to the integrated circuit, a plurality of pads 903 as a second external connecting terminal formed on the printed wiring board 901, and a plurality of conductive materials 904 (e.g. a solder, a conductive resin, an Ag paste) electrically connected between each of leads 902 and each of pads 903.

The second preferred embodiment of the present invention is characterized by each of pads 903 having a width equal to or narrower than each of leads 902 and having a convex surface. As a result, the respective conductive materials 904 is formed so as to cover a sidewall of the respective pads 903 and the convex surface of the respective pads 903. Here, the convex surface of the respective pads 903 is formed using an etching process or an ion-milling process.

Accordingly, the second preferred embodiment of the present invention can increase a contact area of the conductive material against the pad, compared with the first preferred embodiment of the present invention.

As mentioned above, the second preferred embodiment of the present invention can avoid inferior connections caused by a crack between the lead and the pad as a result of the increased contact area.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A semiconductor module including a semiconductor package surface-mounted on a circuit board, comprising:
   a plurality of leads protruding from the semiconductor package, wherein the leads extend in a first direction;
   a plurality of pads on the circuit board, which are located in respective positions under the leads;
   conductive material which is located between the leads and the pads for establishing electrical connection therebetween, wherein the conductive material is formed on side surfaces of the pads and on the surface of the circuit board in the vicinity of the side surfaces, wherein the side surfaces extend in the first direction;
   where in each pad has a convex surface.

2. A semiconductor module including a semiconductor package surface-mounted on a circuit board, comprising:
   a plurality of leads protruding from the semiconductor package, wherein the leads extend in a first direction;
   a plurality of pads on the circuit board, which are located in respective positions under the leads;
   conductive material which is located between the leads and the pads for establishing electrical connection therebetween, wherein the conductive material is formed on side surfaces of the pads and on the surface of the circuit board in the vicinity of the side surfaces, wherein the side surfaces extend in the first direction;
   wherein each pad has a width equal to or narrower than that of the lead in a second direction which is perpendicular to the first direction.

3. A semiconductor module comprising:
   a circuit board having a main surface;
   a semiconductor package positioned over the main surface of the circuit board;
   a plurality of leads extending exteriorly from the semiconductor package towards the main surface of the circuit board, wherein exposed ends of the plurality of leads are bent in a first direction which is parallel with the main surface of the circuit board;
   a plurality of elongate pads located on the main surface of the circuit board, wherein the elongate pads extend lengthwise in the first direction and are aligned under the plurality of leads, respectively; and
   conductive material which is located between the plurality of leads and the respective elongate pads for establishing electrical connection therebetween, wherein the conductive material is formed on elongate side surfaces of the elongate pads and on the main surface of the circuit board in the vicinity of the elongate side surfaces;
   wherein each elongate pad has a convex surface.

4. A semiconductor module comprising:
   a circuit board having a main surface;
   a semiconductor package positioned over the main surface of the circuit board;
   a plurality of leads extending exteriorly from the semiconductor package towards the main surface of the circuit board, wherein exposed ends of the plurality of leads are bent in a first direction which is parallel with the main surface of the circuit board;
   a plurality of elongate pads located on the main surface of the circuit board, wherein the elongate pads extend lengthwise in the first direction and are aligned under the plurality of leads, respectively; and
   conductive material which is located between the plurality of leads and the respective elongate pads for establishing electrical connection therebetween, wherein the conductive material is formed on elongate side surfaces of the elongate pads and on the main surface of the circuit board in the vicinity of the elongate side surfaces;
   wherein each elongate pad has a width equal to or narrower than that of the lead in a second direction which is perpendicular to the first direction.

5. A semiconductor module comprising:
   a circuit board having a main surface;
   a semiconductor package positioned over the main surface of the circuit board;
   a plurality of leads extending exteriorly from the semiconductor package towards the main surface of the circuit board, wherein exposed ends of the plurality of leads are bent such that an end portion of each of the plurality of leads extends lengthwise away from the semiconductor package in a first direction which is parallel with the main surface of the circuit board;
   a plurality of elongate pads located on the main surface of the circuit board, wherein the elongate pads extend lengthwise in the first direction and have upper surfaces which are aligned under the end portions of the plurality of leads, respectively, and wherein the upper surface of each of the plurality of elongate pads is defined between opposite first and second edges extending in the first direction; and conductive material which is located between the plurality of leads and the respective elongate pads for establishing electrical connection therebetween, wherein the conductive material extends between the upper surface of each elongate pad and the end portion of each respective lead, and wherein the conductive material further extends over the opposite first and second edges of each pad and contacts the circuit board at opposite elongate sides of each pad.

6. The connecting portions according to claim 5, wherein the conductive material covers side surfaces of the exposed ends of the leads.

* * * * *